(12) United States Patent
Morrison et al.

(10) Patent No.: US 6,983,394 B1
(45) Date of Patent: Jan. 3, 2006

(54) METHOD AND APPARATUS FOR CLOCK SIGNAL PERFORMANCE MEASUREMENT

(75) Inventors: Shawn K. Morrison, San Jose, CA (US); Andrew K. Percey, Sunnyvale, CA (US); John D. Logue, Placerville, CA (US); James M. Simkins, Park City, UT (US); Nicholas J. Sawyer, Opio (FR)

(73) Assignee: Xilinx, Inc., San Jose, CA (US)

( * ) Notice: Subject to any disclaimer, the term of this patent is extended or adjusted under 35 U.S.C. 154(b) by 547 days.

(21) Appl. No.: 10/351,033

(22) Filed: Jan. 24, 2003

(51) Int. Cl.
 *G06F 1/04* (2006.01)
(52) U.S. Cl. ................................ 713/500; 713/503
(58) Field of Classification Search ........ 713/400–501, 713/503, 600
See application file for complete search history.

(56) References Cited

U.S. PATENT DOCUMENTS

| | | | |
|---|---|---|---|
| 5,206,861 A * | 4/1993 | Hannon et al. ............. 714/731 |
| 5,889,435 A * | 3/1999 | Smith et al. ................. 331/1 A |
| 6,374,361 B1 * | 4/2002 | Lee et al. .................... 713/503 |
| 6,470,483 B1 * | 10/2002 | Rodriguez et al. ............. 716/6 |
| 6,779,123 B2 * | 8/2004 | Simon et al. ................ 713/400 |

* cited by examiner

Primary Examiner—Dennis M. Butler
(74) Attorney, Agent, or Firm—W. Eric Webostad (57) ABSTRACT

Method and apparatus for providing a measure of jitter and skew of a clock signal is described. The clock signal may be used as an input to a digital circuit. In one embodiment, a digital delay circuit is used in conjunction with a processing circuit to continuously measure the jitter of an input clock signal, thus providing clock signal performance measurement over time. In another embodiment, a pair of digital delay circuits are used to continuously measure the skew or delay between a reference clock signal and a input clock signal, thus providing a measurement of the skew of the input clock signal over time. The digital delay circuit(s) are formed on-chip, and thus an on-chip determination of jitter or skew may be provided.

40 Claims, 9 Drawing Sheets

METHOD AND APPARATUS FOR CLOCK SIGNAL PERFORMANCE MEASUREMENT

FIELD OF THE INVENTION

One or more aspects of the present invention relate generally to measurement of clock signal performance, and more particularly to measuring at least one of clock signal jitter and skew.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, called a field programmable gate array (FPGA), is very popular because of a superior combination of capacity, flexibility, time-to-market, and cost. An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA.

Conventionally, a PLD is provided at least one external clock signal to generate at least one internal clock signal to operate internal components, including digital circuits. An external oscillator and clock networks are conventionally used to provide external clock signals.

Performance of a PLD may be adversely affected by a timing clock input signal having instability issues such as jitter and skew. Variations in at least one of clock signal frequency and phase may lead to incorrect operation of a PLD.

Others have attempted to resolve clock signal stability issues by relying on phase locked loops (PLLs). However, PLL implementations conventionally rely on a reference oscillator, such as voltage controlled crystal oscillator (VCXO) that is sensitive to vibration and thermal drift. Such a VCXO can add significant cost.

Others have compared an output clock signal of a PLD to an external clock signal input to such a PLD. Unfortunately, signal noise associated with input/output (I/O) signals used in operation of a PLD may introduce noise during a measurement, which noise reduces accuracy of a comparison between an output clock signal and an input clock signal. To address this inaccuracy, expensive external measurement systems, such as oscilloscopes, specialized clock signal measurement systems, and the like are used.

Accordingly, it would be desirable and useful to provide a reliable and cost effective measurement means to determine clock signal performance. Moreover, it would be desirable and useful to provide for on-chip measurement of at least one aspect of clock signal performance to avoid having to use expensive external equipment to measure such performance.

SUMMARY OF THE INVENTION

An aspect of the present invention is a method for determining clock signal jitter. A delay circuit is provided. A system clock signal is provided to the delay circuit. A reference clock signal is provided to operate the delay circuit. A first measurement signal is sent from the delay circuit representing a first time delay of the system clock signal relative to the reference clock signal. A second measurement signal is outputted from the delay circuit representing a second time delay of the system clock signal with respect to the reference clock signal. A time difference is determined between the first time delay and the second time delay.

An aspect of the present invention is a method for determining clock signal skew. A first time delay determination circuit is provided. A first clock signal is provided to the first time delay determination circuit. A second time delay determination circuit is provided. A second clock signal is provided to the second time delay determination circuit. A reference clock signal is provided to operate the first time delay determination circuit and the second time delay determination circuit. A first measurement signal is output from the first time delay determination circuit indicative of a first clock signal time delay relative to the reference clock signal. A second measurement signal is output from the second time delay determination circuit indicative of a second clock signal time delay relative to the reference clock signal. A time difference between the first clock signal time delay and the second clock signal time delay is determined.

An aspect of the present invention is an apparatus to determine clock signal noise. A delay circuit is coupled to receive a clock signal and a reference signal and configured to provide an output signal indicative of delay between the clock signal and the reference signal. A measuring circuit is configured to receive and process the output signal to provide a measurement value. A data processing circuit is configured to: store the measurement value as a reference value; compare the reference value to one of a plurality of measurement values to determine a first delay value between the clock signal and the reference signal; compare the reference value to another one of the plurality of measurement values to determine a second delay value between the clock signal and the reference signal; and compare the first delay value to the second delay value to determine a time difference.

BRIEF DESCRIPTION OF THE DRAWINGS

Accompanying drawing(s) show exemplary embodiment(s) in accordance with one or more aspects of the present invention; however, the accompanying drawing(s) should not be taken to limit the present invention to the embodiment(s) shown, but are for explanation and understanding only.

FIG. 5-1 is a schematic diagram of an exemplary embodiment of a relative phase encoder used with FIG. 4 in accordance with one or more aspects of the present invention.

FIG. 5-2 is a timing diagram of an exemplary embodiment of a sampled input signal and a clock signal provided to the relative phase encoder of FIG. 5-1.

DETAILED DESCRIPTION OF THE DRAWINGS

Figure 1:
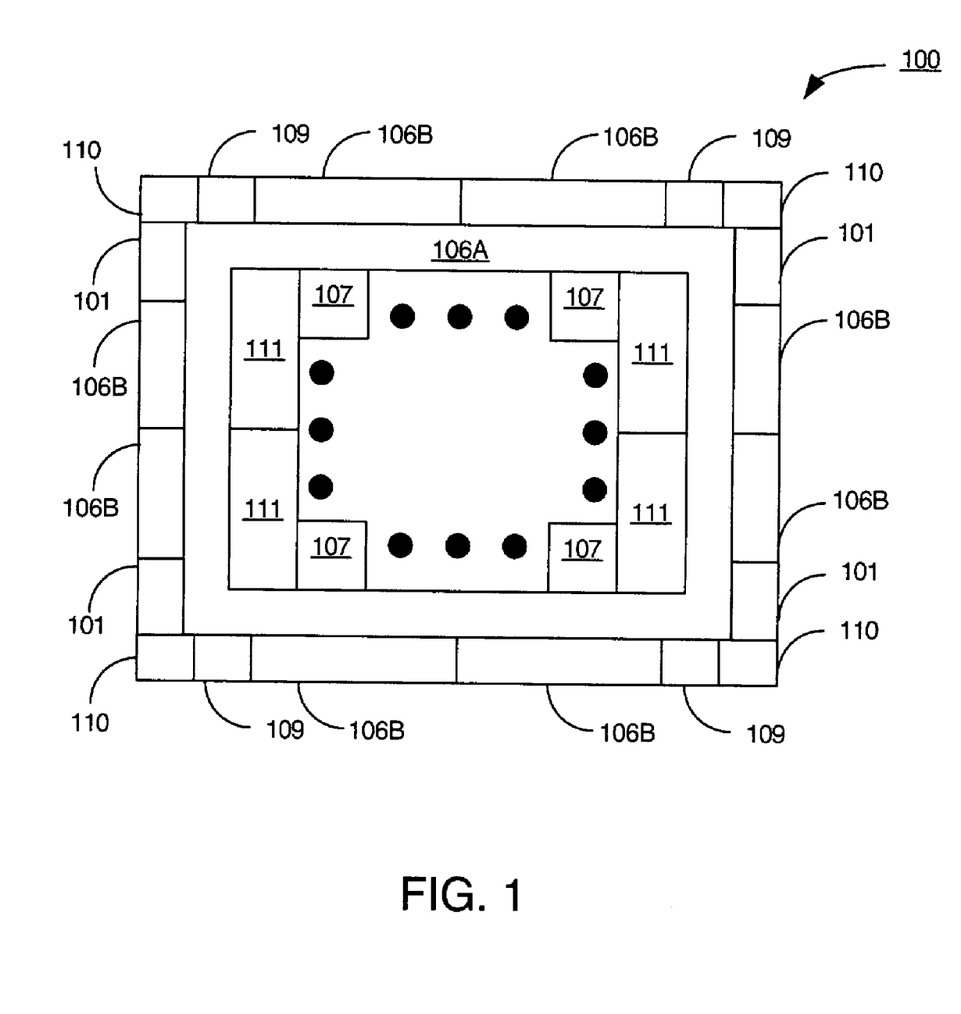
FIG. 1 is a block diagram of an exemplary embodiment of a field programmable gate array in accordance with one or more aspects of the present invention.

FIG. 1 is a block diagram of an exemplary embodiment of an FPGA 100 in accordance of one or more aspects of the present invention. FPGA 100 includes CLBs 107, I/O routing ring 106A, memory, such as random access memory 111, delay lock loops (DLLs) 109, multiply/divide/de-skew clock circuits 110, and programmable Input/output blocks IOBs 106B. DLLs 109 and clock circuits 110 collectively provide digital clock modules (DCMs). FPGA 100 also includes digital performance meter(s) (DPM) 101 to measure performance of one or more clock signals as described below in more detail. DPM 101 may be configured to measure performance of one or more clock signals used with other types of integrated circuits and may be an independent integrated circuit.

Figure 2:
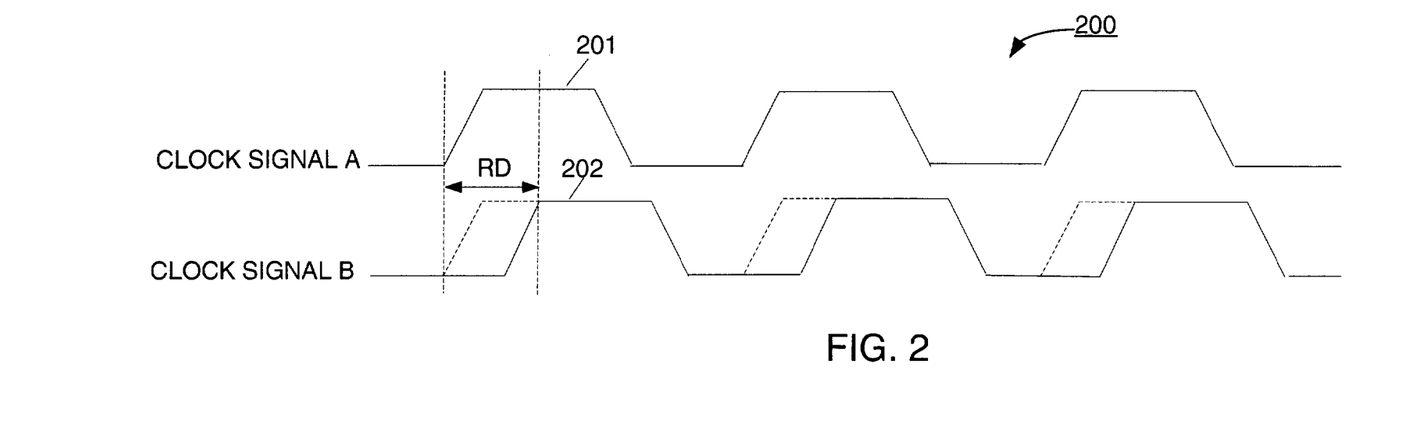
FIG. 2 is a signal diagram of exemplary output waveform to show relative clock signal jitter between two clock signals in accordance with one or more aspects of the present invention.

FIG. 2 is a signal diagram of exemplary output waveforms 200 to show relative clock signal jitter between two clock signals in accordance with one or more aspects of the present invention. Clock signals A and B may be external to and coupled to FPGA 100 shown in FIG. 1. For purposes of clarity, only two non-phase locked external clock signals are shown; however, one or more external clock signals may be provided. Waveform 201 illustrates clock signal A and waveform 202 illustrates clock signal B. As clock signal A and clock signal B are not phase-locked, they will tend to shift in an uncontrolled manner in phase overtime in a range from zero degrees to about 360 degrees from one another. Using clock signal A as a reference signal to clock signal B, relative phase shift may be measured between clock signal A and clock signal B. Relative phase shifts over time between two or more non-correlated (i.e., unrelated) clock signals is known as clock signal jitter (i.e., jitter). Clock signal jitter may be correlated to time delay as is known. For example, as shown in FIG. 2, clock signal B has relative delay over time of "RD" with respect to clock signal A.

Figure 3:
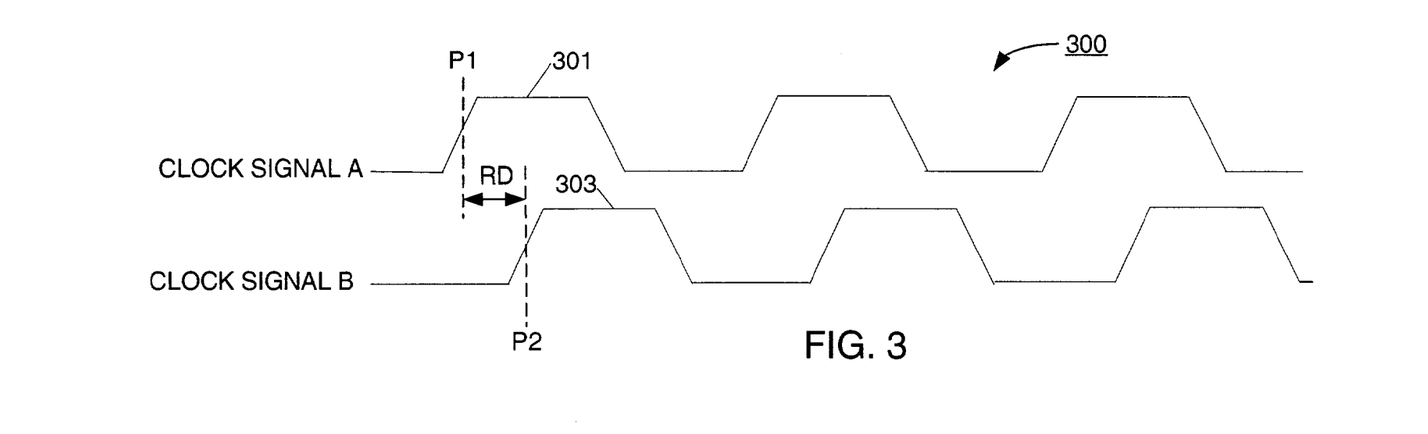
FIG. 3 is a signal diagram of exemplary output waveform to show relative skew between two clock signals in accordance with one or more aspects of the present invention.

FIG. 3 is a signal diagram of exemplary output waveforms 300 to show relative skew between two related clock signals in accordance with one or more aspects of the present invention. With continuing reference to FIG. 3 and renewed reference to FIG. 1, clock signals inputted into FPGA 100 may be split into two or more clock signals that are then routed to various locations within FPGA 100. Moreover, two or more independent clock signals inputted into FPGA 100 may be phase locked to establish a stable phase relationship between such signals. Due to internal impedances and delays between functional sections of FPGA 100, clock signals that are split and clock signals that are phase locked may become delayed relative to one another at various locations within FPGA 100. A relative delay between two or more related clock signals is called skew. Skew differs from jitter as skew is a relative phase delay that tends to be approximately constant. For example, FIG. 3 shows clock signal A, waveform 301, and related clock signal B waveform 303, skewed by a relative fixed time delay "RD" between clock signal A and clock signal B.

Figure 4:
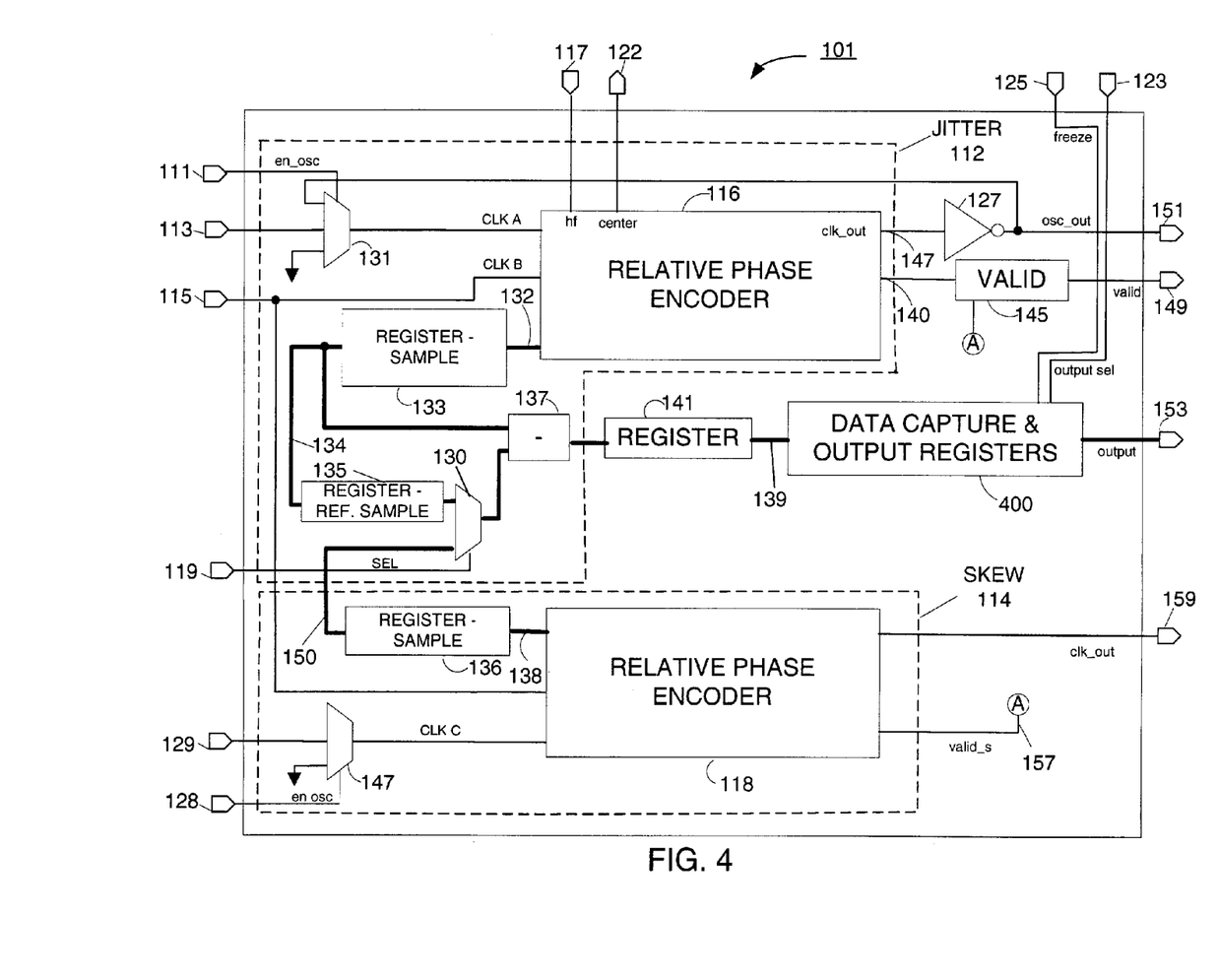
FIG. 4 is a block diagram of an exemplary embodiment of a digital performance meter in accordance with one or more aspects of the present invention.

FIG. 4 is a block diagram of an exemplary embodiment of a DPM 101 in accordance with one or more aspects of the present invention. For purposes of clarity, DPM 101 is described in terms of a FPGA 100 having flip-flops, though it will be apparent that other well-known integrated circuits, such as microprocessors, microcontrollers, digital signal processors, application specific circuits, application specific standard products, and the like, may be used. Furthermore, DPM 101 may be implemented using programmable interconnect structure of FPGA 100.

DPM 101 may be configured to measure jitter and skew of clock signals that are synchronous or asynchronous to a base clock signal. Such base clock signals may generally be used to operate FPGA 100 of FIG. 1, and may be used as a reference clock for jitter or skew measurements. A base clock signal may be provided at a frequency approximately equal to a frequency of a clock signal being measured. Jitter and skew measurements may be made when such a clock being measured drifts sufficiently close in phase to such a base clock signal, without having to lock base and measured clock signals together. However, by locking base and measured clock signals together, phase drift between such signals may be reduced or avoided. While phase or frequency locking a base and measured clock signal together adds additional circuitry, additional benefits such as providing a fixed phase relationship between such signals may be provided.

To measure jitter and skew, DPM 101 is divided into a signal jitter measurement section 112 and a signal skew measurement section 114. Signal jitter measurement section 112 may be configured to measure jitter from clock signal period to clock signal period (i.e., period-to-period jitter), as well as from clock signal cycle to clock signal cycle (i.e., cycle-to-cycle jitter). Period-to-period jitter (PPJ) is a change between an operational clock signal period and a target clock signal period over one or more clock signal periods. Cycle-to-cycle jitter (CCJ) is a change of a clock period between two or more successive clock periods.

Signal jitter measurement section 112 includes clock signal input 113, select signal input 111, clock signal input 115, and signal select input 119. Signal jitter measurement section 112 also includes a valid output signal 140 coupled to measurement verification circuit (MVC) 145 described below in more detail with respect to FIG. 6.

Figure 51:
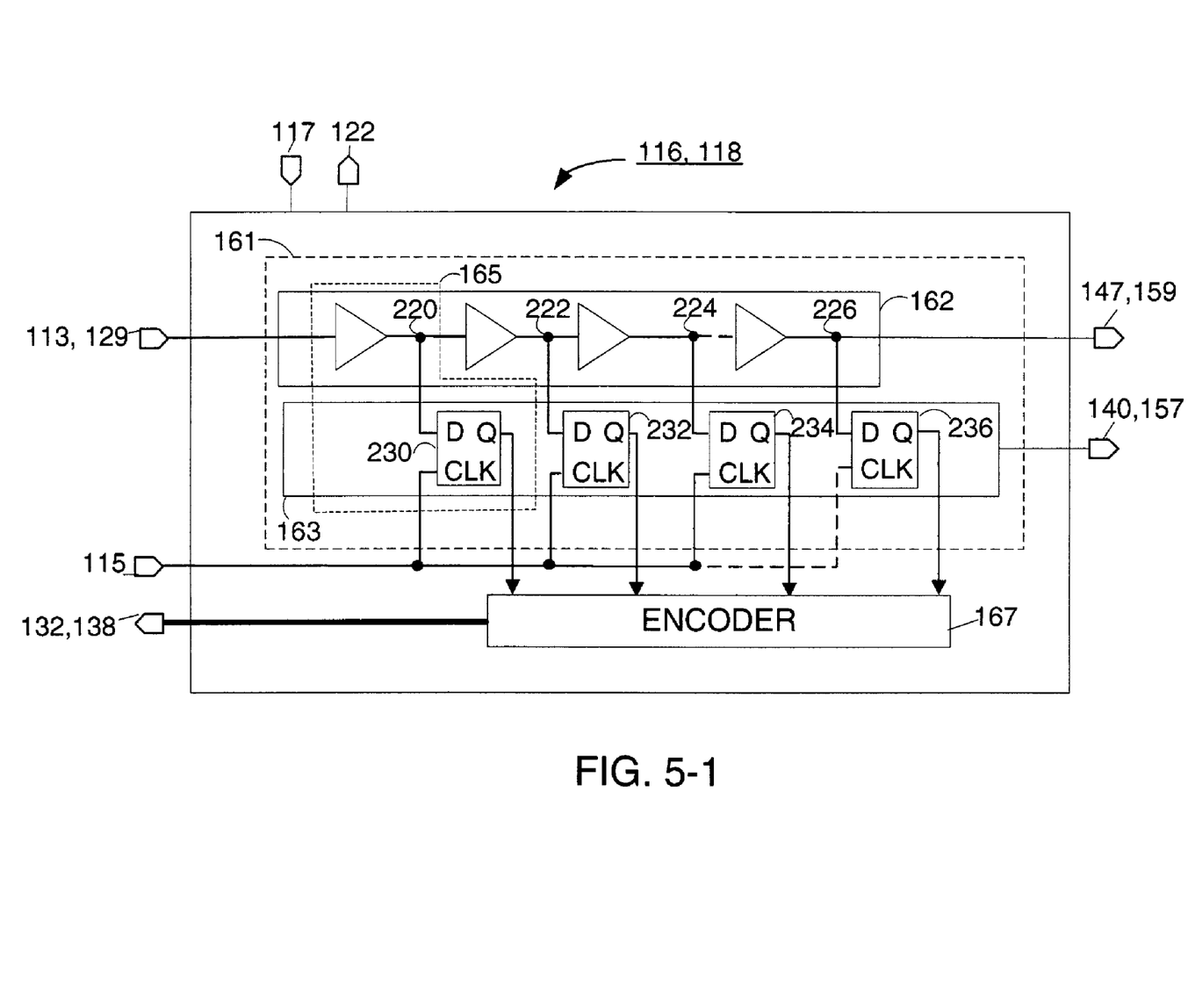

Signal jitter measurement section 112 may include a clock signal output 147 coupled to an input of an inverter 127. The output of inverter 127 may be coupled to clock A input via multiplexer (MUX) 131 to provide an oscillator output signal. Such oscillator output signal may be coupled to oscillator output 151 that may be used for calibration purposes. Signal jitter measurement section 112 may also include high frequency enable input 117 and center delay output 122 described below in more detail with respect to FIG. 5.

Signal jitter measurement section 112 includes a relative phase encoder 116 (RPE) and data signal capture register 133. RPE 116 is configured to receive clock signal A, being measured for jitter, through a MUX 131 from clock signal input 113, where select signal input 111 is used as a select signal to MUX 131. RPE 116 is also configured to receive a clock signal B from clock signal input 115, and output binary data indicative of a jitter measurement of clock signal A relative to clock signal B over one clock signal B cycle. Such binary jitter data are clocked over data signal bus 132 from RPE 116 to data signal capture register 133 for storage. For purposes of clarity, binary jitter data will be referred to as "jitter data".

To compare on-going jitter data to stored jitter data for PPJ and CCJ, signal jitter measurement section 112 includes data signal capture register 133 having a data output coupled to data subtraction circuit 137 and also coupled to sample jitter data register 135 via data signal bus 134. Sample data jitter register 135 provides jitter data indicative of sample jitter data (e.g., reference jitter data) to data subtraction circuit 137 via MUX 130, where select signal input 119 couples a select signal to MUX 130. Jitter data stored in data signal capture register 133 and sample jitter data register 135 is simultaneously clocked into data subtraction circuit 137 for subtraction. Resultant subtracted jitter data is outputted from data subtraction circuit 137 to subtraction data register 141 for storage. During operation, subtraction data register 141 provides resultant subtraction PPJ data and CCJ data via data signal bus 139 for processing by data I/O circuit 400 described below in more detail.

Signal skew measurement section 114 cooperates with signal jitter measurement section 112 to measure skew between at least two clock signals correlated to a base clock signal. Signal skew measurement section 114 includes clock signal input 129, clock signal input 115, and select signal input 128. Signal skew measurement section 114 may include a valid measurement output 157 coupled to MVC 145. Signal skew measurement section 114 may include a clock signal output 159 used for calibration purposes.

Signal skew measurement section 114 includes RPE 118 and data signal capture register 136. RPE 118 is configured to receive clock signal C, being measured for skew relative clock signal A. Clock signal C is coupled from clock signal input 129 to RPE 118 through MUX 147, where select signal input 128 is used as a select signal to MUX 147. RPE 118 is also configured to receive clock signal B via clock input 115, and output binary data indicative of a relative phase shift of clock signal C to clock signal B over one clock signal B cycle. Such binary data is clocked over data signal bus 138 from RPE 118 to data signal capture register 136 for storage.

To measure skew, signal skew measurement section 114 clocks relative phase data between clock signal C and clock signal B from data signal capture register 136. Data from data signal capture register 136 is clocked via data bus 150, through MUX 130, to data subtraction circuit 137, where select signal input 119 couples a select signal to MUX 130. Data subtraction circuit 137 subtracts relative phase data between clock signal A and clock signal B from data signal capture register 133 with relative phase data from data signal capture register 136. Data subtraction circuit 137 provides a resultant binary number indicative of a relative phase between clock signal A and clock signal C. In other words, this embodiment measures skew by subtracting a relative phase shift measurement between clock signal A and clock signal B from a relative phase shift measurement between clock signal C and clock signal B. Resultant phase difference measurements are then outputted from data subtraction circuit 137 to data I/O circuit 400 and processed as described below in more detail.

FIG. 5 is a schematic diagram of an exemplary embodiment of an RPE 116,118 used with FIG. 4 in accordance with one or more aspects of the present invention. RPE 116,118 is configured to measure and output a binary number indicative of a relative phase relationship (i.e., time delay) between two or more clock signals used to measure jitter and skew. RPE 116,118 comprises clock signal inputs 113,129 and 115. Clock signal input 113,129 is configured to receive a clock signal A,C being measured for jitter or skew. Clock signal input 115 is configured to receive clock signal B used as a reference and operational clock signal for DPM 101.

To measure such relative phase relationships, RPE 116, 118 includes a delay chain 161 and encoder 167. Delay chain 161 is configured to output time delay signals indicative of a time delay between clock signal A,C and clock signal B to encoder 167. Encoder 167 is configured to encode such delay signals into a binary number indicative of such time delay between clock signal A,C and clock signal B and output such binary numbers to data signal capture register 133,136 via data signal bus 132,138 as described above with respect to FIG. 4.

For purposes of clarity, delay chain 161 is described below in terms of D flip-flops, such as delay flip-flops 230, 232, 234 and 236, and buffer gates, though it will be apparent that other well-known delay circuits may be used. For example, delay chain 161 may comprise discrete delay lines or inductive/capacitive (LC) circuits configured to provide delay. Delay chain 161 comprises buffer gate chain 162 having an input coupled to clock signal input 113 and a plurality of outputs coupled to D flip-flop chain 163. Buffer gate chain 162 and D-flip-flop chain 163 define a plurality of time delay segments 165 coupled in series to provide one or more time delays for clock signal A,C relative clock signal B. As time delay segments 165 are in series, a summation of time delays for each time delay segment 165 approximately equals a total time delay for delay chain 161. For example, if each time delay segment 165 provided 15-picoseconds of time delay, two time delay segments 165 would equal 30-picoseconds of time delay, and so forth. To provide for higher frequency clock signals the number of time delay segments 165 may be changed by enabling high frequency enable input 117. Depending on such higher frequency clock signals, high frequency enable input may increase/decrease such number of time delay segments 165.

Each delay segment 165 is defined by a buffer gate output coupled to a D input of a D flip-flop having an operational clock signal input responsive to clock signal B input to clock signal input 115. Each D flip-flop has a Q output coupled to encoder 167. Each time delay segment 165 outputs a logic high or logic low signal to encoder 167 depending upon a phase relationship of clock signal A,C to clock signal B measured at such time delay segment 165. As each time delay segment 165 is clocked simultaneously by clock signal B, a series of time delay segments 165 will output a series of individual high and low logic levels to encoder 167 in parallel.

Time delay segments 165 may be configured to output a logic high or logic low responsive to a phase relationship between clock signal A,C and clock signal B. In one configuration, when a phase of clock signal A,C is leading clock signal B, time delay segments 165 detecting such leading phase will output logic high. When a phase of clock signal A,C is lagging clock signal B, time delay segments 165 detecting such lagging phase will output logic low.

Figure 52:
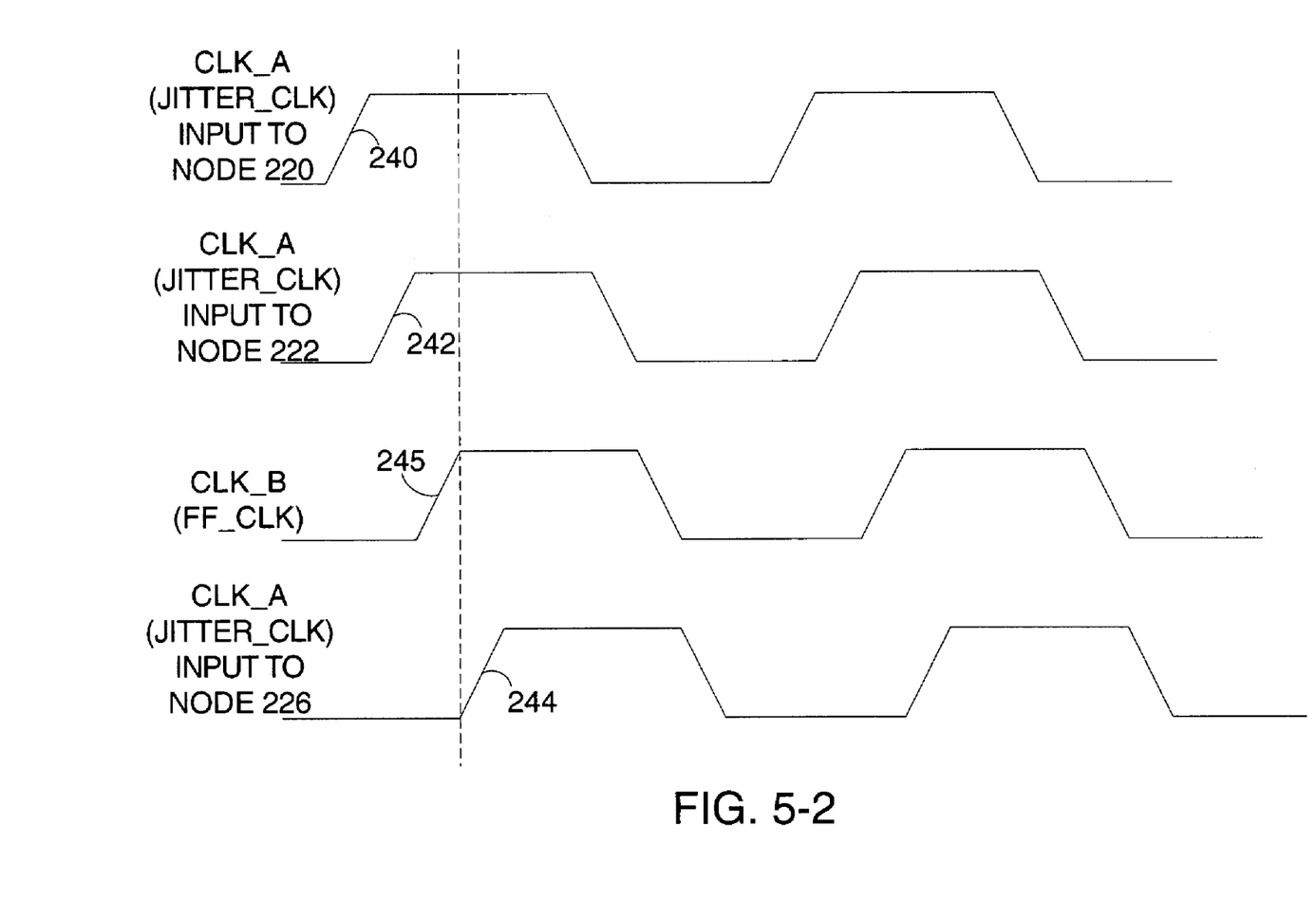

FIG. 5-1 illustrates a pattern of high and low logic levels used to determine jitter and skew of an exemplary embodiment in accordance with one or more aspects of the present invention. For example, let clock signal A enter at input 113 and clock signal B enter at input 115. Assume clock signal A leads clock signal B. FIG. 5-2 shows timing diagrams for D inputs to flip-flops 230, 232, and 234 (nodes 220, 222, and 224 in FIG. 5-1) and for flip-flop(FF) clock 115, i.e., clock signal B. Signal A gets delayed as it moves through buffer chain 161. The rising edges 240 and 242 lead the FF clock edge 245, hence respective Q outputs of flip-flops 230 and 232 are high. At FF 234 signal A has been delayed enough so that its rising edge 244 lags edge 245 and hence Q output of FF 234 is low. Thus, there is a pattern of 1's followed by 0's, as signal edges input to node 226 of flip-flop 236 would lag leading edge 245 of clock signal B. The 1 to 0 transition gives a reference point in the pattern. Jitter and skew are measured by seeing how these 1 to 0 transitions move in the pattern.

The series of 1's followed by 0's are encoded by encoder 167 (FIG. 5) such that an encoded number is the binary number of the flip-flop with the first zero. The encoded number also gives the number of time delays. In one embodiment all 0's or all 1's or a series of 0's followed by a series of 1's are invalid (i.e., valid jitter/slew signal is set low) and are encoded as all 0's. In an alternative embodiment, a series of 0's followed by a series of 1's are valid, and jitter and slew are measured using 0 to 1 transitions.

Table 1 illustrates an example of a binary output of delay chain 161, an encoded binary number from encoder 167 indicative of such a binary output, a time delay UD associated with such encoded binary number between clock A,C and clock signal B, and the valid signal 140, 157. The valid bit, e.g., valid_j or valid_s, is high, e.g., '1', typically when the output of the first flip-flop, e.g., 230, is high and the output of the last flip-flop, e.g., 236 is low. In one embodiment for low frequencies (hf 117=0), there are 64 flip-flops and for high frequencies (hf 117=1), there are 16 flip-flops.

TABLE 1

| OUTPUT Q | ENCODED NUMBER | TIME DELAY | Valid bit |
| --- | --- | --- | --- |
| 0001 | 0001 | 1 × UD | 1 |
| 0011 | 0010 | 2 × UD | 1 |
| 0111 | 0011 | 3 × UD | 1 |
| 1111 | 0000 |  | 0 |
| ... | ... | ... |  |

In one embodiment jitter on clock signal A is measured by inputting clock signal A into input 113 of RPE 116 of FIG. 5-1 and inputting a reference clock B into input 115 of RPE 116 of FIG. 5-1. An encoded number N1 is determined, representing about how much time signal A leads signal B. For example let N1=0001 or one delay unit. At a subsequent time, clock signal A is measured again using RPE 116 FIG. and reference clock B. A new lead time is determined and is given by encoded number N2. For example, let N2= 0011 or three delay units. The difference (N2−N1) represents the jitter in clock signal A. In our example (N2−N1)=0010 or two time delay units. If the time period between measurements is a clock period then period jitter is measured. If the time period is between two successive clock periods then cycle to cycle jitter is measured.

In another embodiment skew is measured between clock signal A to RPE 116 of FIG. 5-1 and clock signal C to RPE 118 of FIG. 5-1 and a reference clock B to RPE 116 of FIG. 5-1. First, clock signal A is sent to input 113 FIG. and a reference clock B is sent into input 115. An encoded number P1 is determined, representing about how much time clock signal A leads signal B. Second, a clock signal C is sent to input 129 FIG. and a reference clock B is sent into input 115. An encoded number P2 is determined, representing about how much time clock signal C leads signal B. The difference (P2−P1) is the skew between clocks A and C.

Figure 6:
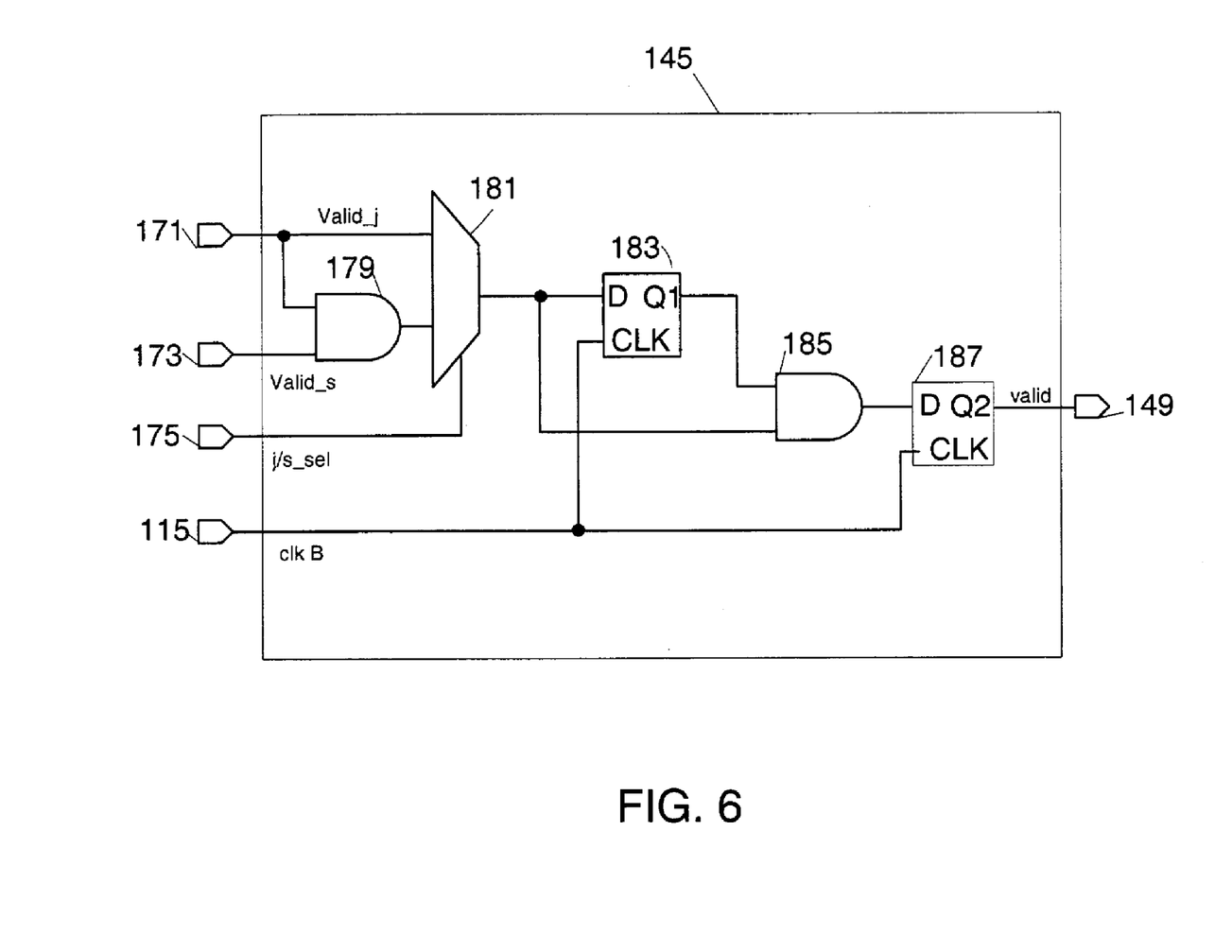
FIG. 6 is a schematic diagram of a measurement verification circuit that may be used with a digital performance meter of FIG. 4 in accordance with one or more aspects of the present invention.

FIG. 6 is a schematic diagram of a MVC 145, which may be used with digital performance meter of FIG. 4 in accordance with one or more aspects of the present invention. MVC 145 includes valid jitter signal input 171, valid skew signal input 173, and is coupled to clock signal input 115. Valid jitter signal input 171 couples valid signal output 140 to MUX 181, where select signal input 175 couples a select signal enable to MUX 181. Valid jitter signal input 171 also couples a valid jitter signal from valid signal output 140 to an input of AND gate 179. Valid skew signal input 173 couples a valid skew signal from valid skew signal output 157 to another input of AND gate 179. AND gate 179 provides an output to MUX 181 indicative of a comparison between such valid jitter and valid skew signals as described below. MVC 145 provides a valid jitter and skew measurement signal via valid signal output 149 indicative of validity of jitter and skew measurements. In this embodiment, for PPJ measurements, at least two valid jitter measurement signals (e.g., two rising clock B edges) in sequence are used to indicate a valid period jitter measurement. For CCJ measurements, at least two valid period jitter measurements in sequence are used to indicate a valid cycle jitter measurement.

For purposes of clarity, an operation of MVC 145 is described below with regard to high logic and low logic, however other logic levels may be used as known. For determining jitter measurement validity, MVC 145 compares a first valid measurement signal "VM1" from valid output 140 to a second subsequent valid measurement signal "VM2". When valid signal input 171 is selected via select signal input 175, VM1 is coupled though MUX 181 to D input of D flip-flop 183. On a first clock signal cycle of clock B, VM1 is clocked to D flip-flop Q1 output coupled to an input of AND gate 185. On a next cycle of clock signal B, AND gate 185 compares VM1 to VM2 coupled to D flip-flop 183 through MUX 181. If VM1 equals VM2 and are both logic high, AND gate 185 provides a high logic to D input of D flip-flop 187. Q2 is set to such high logic level on a next clock cycle of clock signal B. However, if VM1 does not equal VM2, Q2 is set to logic low. Q2 is coupled to valid signal output 149 described below with reference to FIG. 7. In this embodiment, if VM1 and VM2 are at high logic level for two successive cycles of clock signal B, Q2 will remain at such high logic level. In other words, Q2 will remain high as long as two or more successive VMs are valid. If two or more successive VMs are not valid then Q2 would change to a low logic state indicating that a current jitter measurement is invalid. MVC 145 may also be used to delay such valid signals to compensate for a delay in jitter data processing. In other words, MVC 145 may be used to align a valid jitter data signal in time with valid jitter data described below with respect to FIG. 7.

For verifying skew measurements with reference to FIG. 4 above, valid measurement signals from valid signal output 149 and 157 are compared. A valid signal VS1 from valid signal output 140 is coupled via valid signal input 171 to an input of AND gate 179. Another valid signal VS2 from valid signal output 157 is coupled to another input of AND gate 179 via valid signal input 173. When selected, a logic output of AND gate 179 is coupled though MUX 181 to D flip-flop 183. On a first clock signal cycle of clock B, such logic level is clocked to Q1 and then to Q2 as described above. As long as VS1 and VS2 remain at a high logic level, valid signal output will be high logic level. In this embodiment, if both VS1 and VS2 are high logic level, MVS 145 outputs a high logic level indicative of a valid skew measurement for use with FIG. 7, described below. However, if both VS1 and VS2 are not high logic, then a skew measurement is invalid. As above, MVC 145 may also be used to delay such valid skew signals to compensate for a delay in skew data processing. In other words, MVC 145 may be used to align a valid skew data signal in time with valid skew data described below with respect to FIG. 7.

Figure 7:
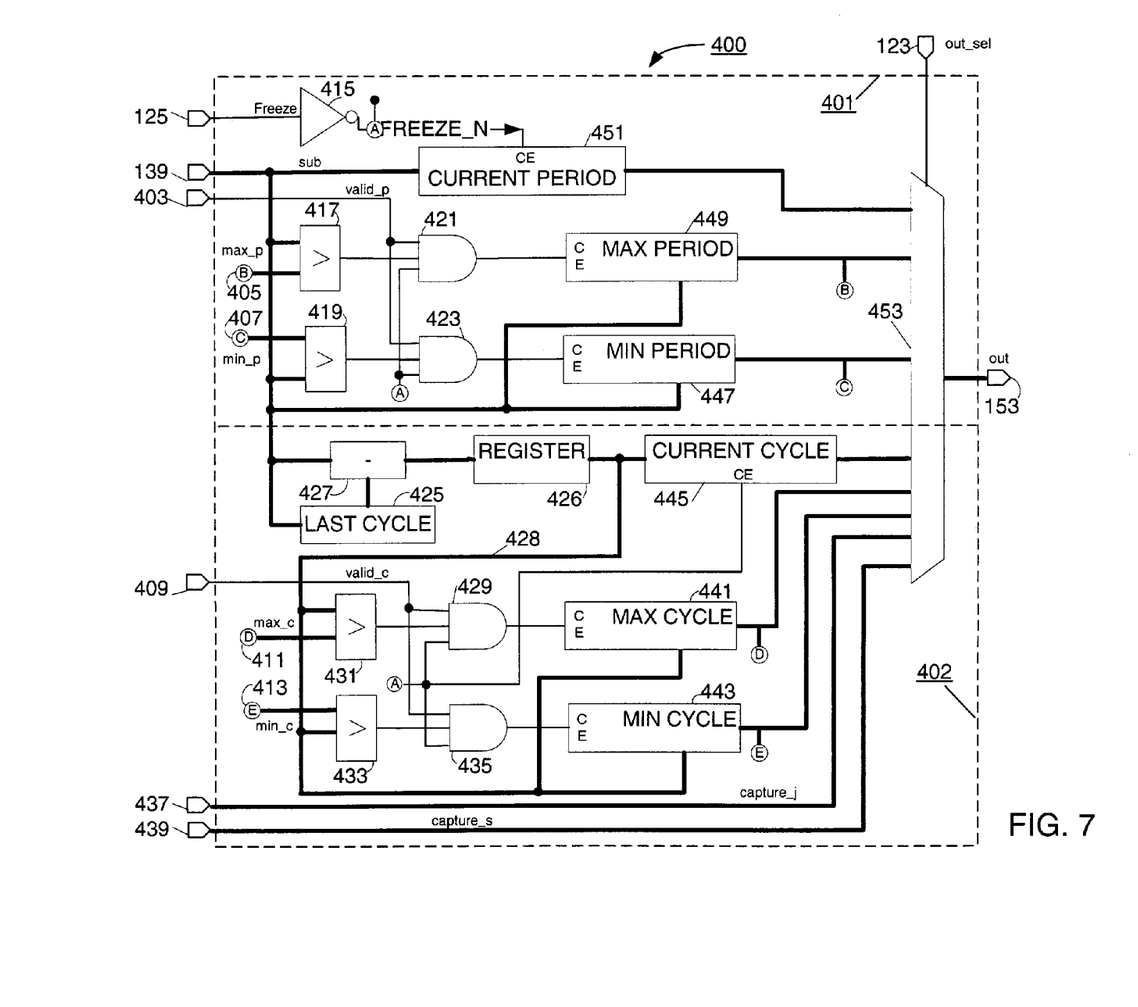
FIG. 7 is a schematic diagram of an exemplary embodiment of a data I/O circuit used with FIG. 4 in accordance with one or more aspects of the present invention.

FIG. 7 is a schematic diagram of an exemplary embodiment of a data I/O circuit (DIO) 400 used with FIG. 4 in accordance with one or more aspects of the present invention. DIO 400 is configured to receive jitter data and skew data for storage and output to one or more external data processing systems, such as computers. Jitter data and skew data are provided to inputs of DIO 400 and external processors via MUX 453 described below. DIO 400 includes a period jitter processing section (PJPS) 401 and a cycle jitter processing section (CJPS) 402. PJPS 401 is configured to receive and compare PPJ data to stored maximum and minimum PPJ data and update maximum and minimum PPJ data as needed. CJPS 402 is configured to compare CCJ data to stored maximum and minimum CCJ data and update maximum and minimum CCJ data as needed.

PJPS 401 includes valid period enable input 403, maximum period data input 405, minimum period data input 407, and "freeze" output enable 125. During a clock signal B cycle, data signal bus 139 couples jitter data from subtraction data capture register 141 to an input of current period register 451, and comparators 417 and 419. Current period register 451 is configured to store current PPJ data for each cycle of clock B and provide such current PPJ data to MUX 453. Data signal bus 139 further couples PPJ data to maximum ("max") period data register 449 and minimum ("min") period data register 447 from data capture register 141. Max period data register 449 is for storing maximum PPJ values, and min period data register 447 is configured to store minimum PPJ values.

During PPJ data measurement, stored values of PPJ are coupled from a data output of max and min period data registers 447 and 449 to max period input 405 and min period input 407, respectively. Comparator 417 is configured to compare PPJ data from data capture register 141 to stored maximum PPJ values from max period data register 449. Simultaneously, comparator 419 is configured to compare such PPJ data to stored minimum PPJ values from min period data register 447. Comparators 417 and 419 output logic levels indicative of whether such PPJ data is greater or less than such stored PPJ data.

To update maximum and minimum PPJ data, PJPS 401 further includes AND gates 421 and 423. AND gate 421 receives input signals from valid period enable input 403, comparator 417, and inverter 415 coupled to "freeze" output enable 125. AND gate 421 provides a chip-enable (CE) logic signal to enable/disable max period data register 449. When logic signals from valid period enable input 403, comparator 417, and inverter 415 are logic high, AND gate 421 provides a logic high signal to enable max period data register 449 to store data from data capture register 141. AND gate 423 receives input signals from valid period enable input 403, comparator 419, and inverter 415 coupled to freeze output enable 125. AND gate 423 provides a chip-enable (CE) logic signal to enable/disable min period data register 447. When logic signals from valid period enable input 403, comparator 419, and inverter 415 are logic high, AND gate 423 provides a logic high signal to enable min period data register 447 to store data in data capture register 141. In other words, depending on an input logic state of AND gates 421 and 423, PPJ data from data capture register 141 may be clocked into max and min period data registers 447 and 449 via data bus 139. For example, if PPJ data were greater than stored PPJ data, AND gate 421 would output high enabling max period register to allow max period data register 449 to be updated with such greater PPJ data.

When asserted, freeze input 125 allows the data from max and min period data registers 447 and 449, and current PPJ register 451 to be held from being updated to allow external data processing systems time to process data. In one configuration, a high logic signal input to freeze input 125 is converted to a low logic level by inverter 415. Such low logic level is used by AND gates 421 and 423 to disable updating max and min period data registers 447 and 449.

During CCJ measurements data signal capture register 141 provides jitter data to CJPS 402. Data signal bus 139 couples jitter data from data signal capture register 141 and provides such data jitter to CCJ subtraction circuit 427 and to last cycle register 425 for storage. CCJ subtraction circuit 427 is configured to subtract jitter data from data signal capture register 141 and last cycle register 425 and provide a resultant CCJ data to CCJ storage register 426. Once such subtraction between jitter data for a current cycle and previous cycle has been executed, last cycle register 425 is updated to such current cycle. Therefore, during operation CCJ subtraction circuit 427 subtracts jitter data corresponding to two successive clock signal cycles (i.e., CCJ data). CJPS 402 may also be configured to directly couple jitter data from data signal capture register 133 and data signal capture register 136 to MUX 453 using data signal bus 134 and 150, respectively. Accordingly, jitter data is coupled from data signal bus 134 to data input 437 to MUX 453, where select signal input 123 is used as a select signal to MUX 453. Similarly, Skew data may be coupled from data signal bus 150 to MUX 453 via data input 439.

During a clock signal B cycle, CCJ data signal bus 428 couples CCJ data from CCJ storage register 426 to an input of current cycle register 445 and comparators 431 and 433. Current period register 445 is configured to store current CCJ data for each cycle of clock B and provide such current CCJ data to an input of MUX 453. Data signal bus 428 further couples such CCJ data to maximum ("max") cycle data register 441 and minimum ("min") cycle data register 443. Max cycle data register 441 and min cycle data registers 443 are configured to respectively store maximum and minimum CCJ values.

During CCJ data measurement, stored values of CCJ are coupled from a data output of max and min cycle data registers 441 and 443 to max cycle input 411 and min cycle input 413, respectively. Comparator 431 is configured to compare CCJ data from capture register 426 to stored maximum CCJ values from max cycle data register 441. Simultaneously or at about the same time, comparator 433 is configured to compare such CCJ data to stored minimum CCJ values from min cycle data register 443. Comparators 431 and 433 output logic levels depending on whether such CCJ data is greater or less than such stored CCJ data.

CJPS 402 includes AND gates 429 and 435 used to update maximum and minimum CCJ data. AND gate 429 receives input signals from valid cycle enable input 409, comparator 431, and inverter 415. AND gate 429 provides chip-enable (CE) logic signal to enable/disable maximum ("max") cycle data register 441. When logic signals from valid cycle enable input 409, comparator 431, and inverter 415 are logic high, AND gate 429 provides a logic high signal to enable max cycle data register 441 to store data from CCJ data register 426. AND gate 435 receives input signals from valid cycle enable input 409, comparator 433, and inverter 415. AND gate 435 provides a chip-enable (CE) logic signal to enable/disable min cycle data register 443. Similarly, when logic signals from valid cycle enable input 409, comparator 433, and inverter 415 are logic high, AND gate 435 provides a logic high signal to enable min period data register 443 to store data received from data capture register 426. In other words, depending on an input logic state of AND gates 429 and 435, CCJ data from data capture register 426 may be clocked into max and min cycle data registers 441 and 443 via data bus 428. For example, if CCJ data were greater than CCJ data stored in max cycle data register 441, AND gate 429 would output high to allow max cycle data register 441 to be updated with such greater CCJ data. Accordingly, CJPS 402 receives and process CCJ data for two successive clock signal cycles, compares a current CCJ data with CCJ data from a previous cycle, and updates max and min cycle data registers 441 and 443 when needed.

Similar to holding PPJ data described above, when asserted, freeze input 125 allows CCJ data from max and min cycle data registers 441 and 443, and current CCJ register 445 to be held from being updated. Such a data hold allows external data processing systems time to process data. In one configuration, a high logic signal input to freeze input 125 is converted to a low logic level by inverter 415. Such low logic level is used by AND gates 429 and 435 to disable updating max and min cycle data registers 441 and 443.

Figure 8:
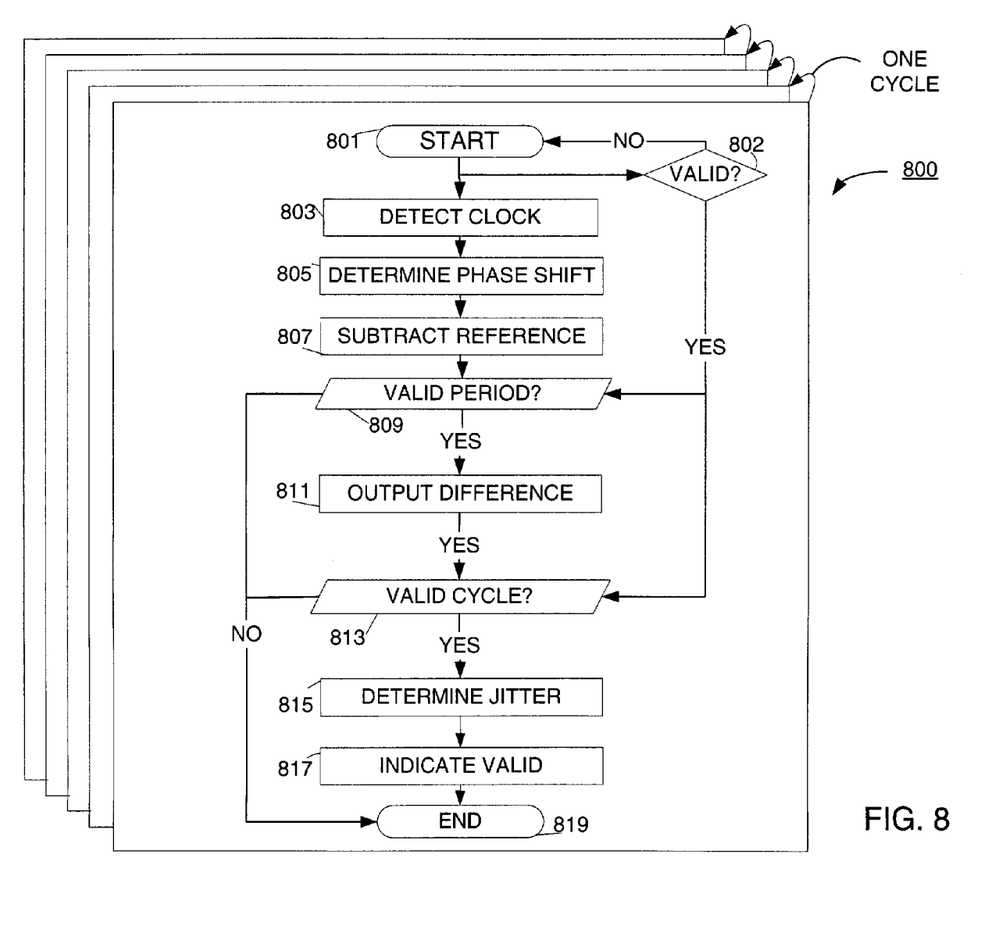
FIG. 8 is a flow diagram of an exemplary embodiment of a determination process for clock signal jitter in accordance with one or more aspects of the present invention.

FIG. 8 is a flow diagram of an exemplary embodiment of a clock signal jitter determination (CSJD) process 800 in accordance with one or more aspects of the present invention. In one aspect, jitter performance may be determined over a plurality of clock cycles for period-to-period jitter and/or cycle-to-cycle jitter. As CSJD process 800 may be "pipelined", a plurality of steps may be accomplished at each cycle of a base clock signal. For example, as illustrated in FIG. 8, five individual cycles are shown.

CSJD process 800 is initiated at step 801 when, for example, DPM 101 is activated, proceeding to step 802 and 803. CSJD process 800 includes two parallel paths—one to determine clock signal jitter and another for validity checking. If a clock signal is not valid, then CSJD process 800 returns to step 801. With regard to a path for determining clock signal jitter, at step 803, CSJD process 800 detects a clock signal. In one aspect, CSJD process 800 detects an edge of a clock signal. An edge may be either a rising edge or falling clock edge. At step 805, CSJD process 800 phase shifts (i.e., time delays) a clock signal and determines a phase shift value (i.e., amount of time delay). At step 807, CSJD process 800 subtracts a phase shift value and a reference phase shift value to produce a resultant phase shift value and proceeds to step 809. If at step 809 a valid was found at step 802, CSJD process 800 determines if a period measurement is valid. If a period measurement is valid then CSJD process 800 proceeds to step 811 and outputs a resultant phase shift value (i.e., PPJ data). A phase shift value may be used to update maximum and minimum phase shift values. For example, with regards to FIG. 7, min period data register 347 and max period data register 349 may be updated to reflect a new value if a resultant phase shift value is greater than a maximum phase shift value or less than a minimum phase shift value. If however, a period measurement was not valid then CSJD process 800 proceeds to step 819 and ends. If at step 813, a valid was found at step 802, CSJD process 800 determines if a cycle-to-cycle phase shift measurement is valid. If a cycle-to-cycle measurement is valid then CSJD process 800 proceeds to step 815. At step 815, CSJD process 800 determines from a resultant phase shift value a jitter value (i.e., CCJ data) and proceeds to step 817 to indicate measurement validity. However, if cycle-to-cycle measurement was not valid at step 813, CSJD process 800 proceeds to step 819 and ends.

Figure 9:
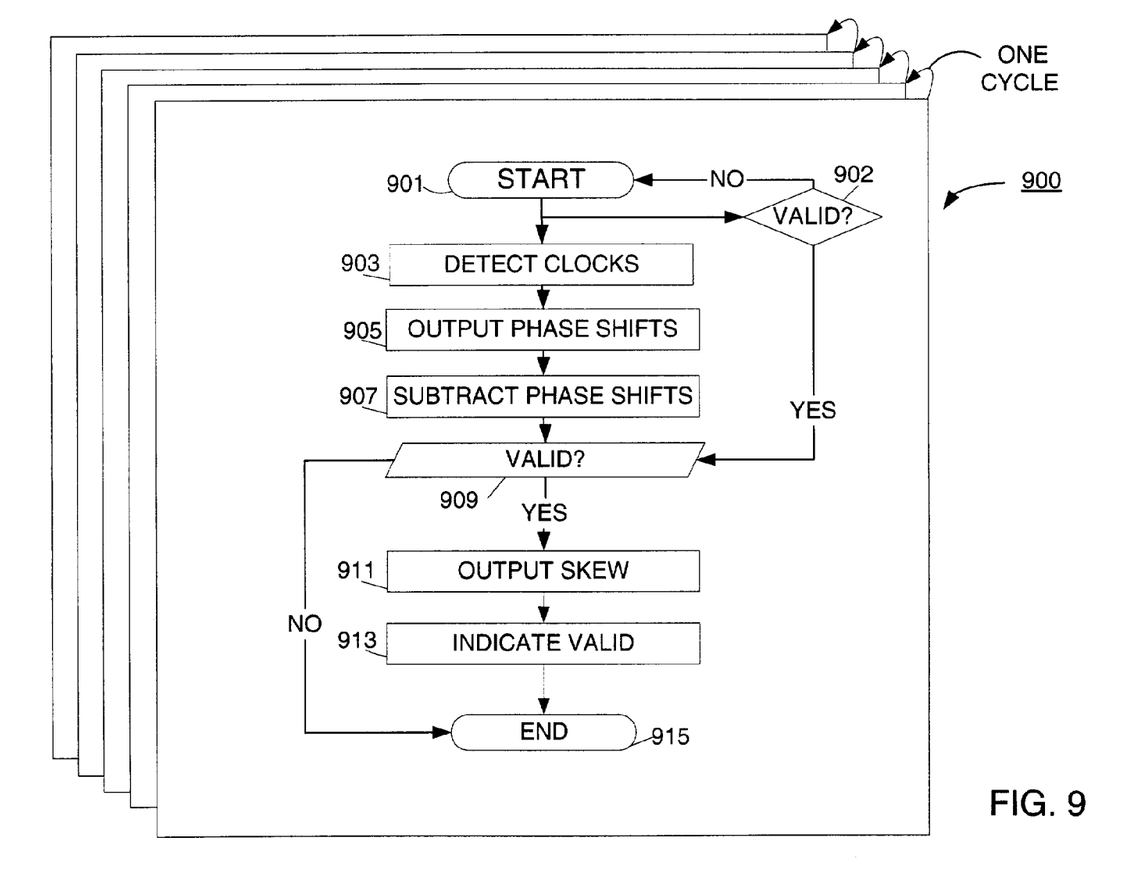
FIG. 9 is a flow diagram of an exemplary embodiment of a determination process for clock signal skew in accordance with one or more aspects of the present invention.

FIG. 9 is a flow diagram of an exemplary embodiment of a clock skew determination ("CSD") process 900 between at least two clock signals in accordance with one or more aspects of the present invention. Skew may be determined over a plurality of clock cycles. As CSD process 900 may be "pipelined", a plurality of steps may be accomplished at each cycle of a base clock signal. For example, as illustrated in FIG. 9, five cycles are shown.

CSD process 900 is initiated at step 901 when, for example, DPM 101 is activated, proceeding to step 902 and 903. CSD process 900 includes two parallel paths. One with respect to determine clock signal skew and another path for measurement validity. In one aspect, at step 902, CSD process determines if two clock signal phase measurements are valid. If two clock signal measurements are not valid, then CSD process returns to step 901. At step 903, CSD process detects at least two clock signals. In one aspect, CSD process 900 detects an edge of at least two clock signals. An edge may be either a rising edge or falling clock edge.

At step 905, CSD process 900 determines a phase shift value of a first clock signal and a phase shift value of a second clock signal relative a base clock signal. At step 907, CSD process 900 subtracts a first phase shift value and second phase shift value to determine a resultant phase shift value, and proceeds to step 909. If at step 909 a valid was found at step 902, CSD process 900 determines if a phase shift measurement of two clock signals are valid. If from step 902 above, a phase shift measurement of two clock signals are valid, then CSD process 900 proceeds to step 911 and outputs a skew value. At step 913, CSD process 900 outputs a valid indication and then ends at step 915. If however, a phase shift measurement of two clock signals were not valid, then CSD process 900 proceeds to step 915 and ends.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps.

What is claimed is:

1. A method for determining relative clock signal jitter, comprising:
providing a delay circuit;
providing a system clock signal to the delay circuit;
providing a reference clock signal to operate the delay circuit;
outputting a first measurement signal from the delay circuit representing a first time delay of the system clock signal relative to the reference clock signal;
outputting a second measurement signal from the delay circuit representing a second time delay of the system clock signal with respect to the reference clock signal; and determining a time difference between the first time delay and the second time delay.

2. The method of claim 1, wherein the determining the first time delay comprises:
detecting a system clock edge of the system clock;
detecting a reference clock edge of the reference clock; and
determining the first time delay between the system clock edge detected and the reference clock edge detected.

3. The method of claim 1, wherein the outputting of the first measurement signal comprises encoding the first measurement signal.

4. The method of claim 1, wherein the outputting the second measurement signal comprises encoding the second measurement signal.

5. The method of claim 1, further comprising:
providing another system clock signal to another delay circuit; and
determining a skew between the system clock signal and the other system clock signal.

6. A method for determining jitter of a on-chip clock signal with respect to a reference clock signal, comprising:
delaying the on-chip clock signal relative to the reference clock signal;
providing a signal output indicative of delay of the on-chip clock signal relative to the reference clock signal;
detecting a transition of the on-chip clock signal;
measuring a first time delay initiated from the transition relative to the reference clock signal;
outputting a binary number indicative of the first time delay;
detecting another transition of the on-chip clock signal;
measuring a second time delay initiated from the other transition relative to the reference clock signal;
outputting another binary number indicative of the second time delay; and
determining a time difference between the first time delay and the second time delay.

7. The method of claim 6, wherein the detecting the transition comprises:
providing a delay circuit;
clocking the delay circuit with the reference clock signal; and
detecting at least one edge of the clock signal.

8. The method of claim 6, wherein the outputting the binary number comprises outputting at least two signals representing a transition binary number.

9. The method of claim 8, wherein the outputting the other binary number comprises outputting at least two signals representing a another transition binary number.

10. The method of claim 6, wherein the determining the time difference comprises subtracting the binary number from the other binary number.

11. A method for determining jitter, comprising:
delaying a first clock signal relative to a reference clock signal;
providing a first signal output responsive to delay of the first clock signal relative to the reference clock signal;
detecting a first transition of the first clock signal;
measuring a first time delay associated with the first transition relative to the reference clock signal;
outputting a first binary number for the first time delay;
detecting a second transition of the first clock signal;
measuring a second time delay initiated from the second transition relative to the reference clock signal;
outputting a second binary number for the second time delay; and
determining a time difference between the first time delay and the second time delay.

12. The method of claim 11, further comprising determining skew between the clock signal and another clock signal.

13. The method of claim 12, wherein the determining the skew comprises detecting a transition of the other clock signal.

14. The method of claim 13, further comprising;
outputting a third binary number responsive to a third time delay relative to the reference clock signal for the other clock signal; and
subtracting the first time delay from the third time delay.

15. A method for determining clock signal skew, comprising:
providing a first time delay determination circuit;
providing a first clock signal to the first time delay determination circuit;
providing a second time delay determination circuit;
providing a second clock signal to the second time delay determination circuit;
providing a reference clock signal to operate the first time delay determination circuit and the second time delay determination circuit;
outputting a first measurement signal from the first time delay determination circuit indicative of a first clock signal time delay relative to the reference clock signal;
outputting a second measurement signal from the second time delay determination circuit indicative of a second clock signal time delay relative to the reference clock signal; and
determining a time difference between the first clock signal time delay and the second clock signal time delay.

16. The method of claim 15, wherein the outputting the first measurement signal comprises:
encoding the first measurement signal; and
outputting from the first time delay determination circuit a first binary number indicative of the first clock signal time delay.

17. The method of claim 16, wherein the outputting the signal measurement signal comprises:
encoding the second measurement signal; and
outputting from the second time delay determination circuit a second binary number indicative of second clock signal time delay.

18. The method of claim 17, wherein the step of determining a time difference comprises subtracting the first binary and second binary number.

19. An apparatus to determine clock signal noise, comprising:
a delay circuit coupled to receive a clock signal and a reference signal and configured to provide an output signal indicative of delay between the clock signal and the reference signal;
a measuring circuit configured to receive and process the output signal to provide a measurement value; and
a data processing circuit configured to:
store the measurement value as a reference value;
compare the reference value to one of a plurality of measurement values to determine a first delay value between the clock signal and the reference signal;

compare the reference value to another one of the plurality of measurement values to determine a second delay value between the clock signal and the reference signal; and compare the first delay value to the second delay value to determine a time difference.

20. The apparatus of claim 19, wherein the apparatus is coupled to a programmable logic device.

21. The apparatus of claim 19, wherein at least some part of the apparatus is implemented within a fabric of a programmable logic device.

22. The apparatus of claim 19, wherein the measuring circuit comprises an encoder configured to receive the output signal to provide at least some of the plurality of measurement values.

23. The apparatus of claim 22, wherein the data processing circuit comprises a subtraction circuit configured to provide a resultant value between the reference value and at least one of the plurality of measurement values.

24. The apparatus of claim 22, wherein the data processing circuit comprises a register configured to store the reference value.

25. The apparatus of claim 19, wherein the output signal represents a plurality of time delay values.

26. The apparatus of claim 25, wherein the plurality of time delay values increment to provide at least a portion of a total time delay.

27. The apparatus of claim 19, further comprising another delay circuit, the other delay circuit coupled to receive another clock signal and the reference clock signal and configured to provide another output signal, the other output signal indicating delay between the other clock signal and the reference clock signal.

28. The apparatus of claim 27, further comprising another measuring circuit configured to receive and process the other output signal to provide another measurement value.

29. The apparatus of claim 27, wherein the data processing circuit is configured to compare delays between the clock signal and the other clock signal with respect to the reference clock signal to determine a skew therebetween.

30. A system for measuring jitter of an input signal, comprising:

a relative phase encoder, the relative phase encoder including a delay chain and flip-flops, the delay chain having a plurality of tap nodes, the plurality of tap nodes respectively connected to flip-flop delay inputs of the flip-flops for sampling the input signal to the delay chain, the relative phase encoder configured to receive a clock signal to first flip-flop clock inputs of the flip-flops, the relative phase encoder having an encoder respectively coupled to flip-flop outputs of the flip-flops and configured to provide encoded phase of the input signal relative to the clock signal responsive to the flip-flop outputs; and a data compare circuit coupled to receive the encoded phase and configured to compare the encoded phase with a stored reference sample.

31. The system of claim 30, wherein the stored reference sample is obtained from a prior instance of the encoded phase for the input signal.

32. The system of claim 31, wherein the data compare circuit comprises registers for storing the encoded phase and the stored reference sample.

33. The system of claim 32, wherein the data compare circuit comprises a subtractor coupled to receive the stored reference sample and the encoded phase stored to provide a difference output, wherein the difference output represents at least a portion of the jitter.

34. The system of claim 33, further comprising a validity check circuit coupled to the relative phase encoder to check validity of output on the flip-flop outputs.

35. The system of claim 34, further comprising a data interface coupled to the data compare circuit and configured to provide at least one of maximum and minimum period-to-period jitter.

36. The system of claim 34, further comprising a data interface coupled to said data compare circuit and configured to provide at least one of maximum and minimum cycle-to-cycle jitter.

37. The system of claim 34, further comprising a data interface coupled to said data compare circuit and configured to provide cycle-to-cycle jitter for each cycle of said clock signal.

38. A system for measuring skew between a plurality of signals, comprising:

a first and a second relative phase encoder, each said first and said second relative phase encoder including a delay chain and flip-flops, each said delay chain having a plurality of tap nodes respectively connected to flip-flop delay inputs of said flip-flops, each said delay chain for sampling a respective input signal of said plurality of signals, each said first and said second relative phase encoder configured to receive a clock signal to clock said flip-flops, said first and said second relative phase encoder each having an encoder respectively coupled to outputs of said flip-flops, each said encoder configured to respectively provide encoded phase for each of said plurality of signals relative to said clock signal; and a data compare circuit coupled to receive each said encoded phase and configured to compare each said encoded phase with each other.

39. The system of claim 38, wherein said data compare circuit comprises a subtractor operably coupled to provide a difference representing the skew.

40. The system of claim 38, further comprising a validity check circuit respectively coupled to said first and said second relative phase encoder to check validity of said outputs.

* * * * *